United States Patent
Lai

(10) Patent No.: US 7,685,486 B1
(45) Date of Patent: Mar. 23, 2010

(54) TESTING OF AN EMBEDDED MULTIPLEXER HAVING A PLURALITY OF INPUTS

(75) Inventor: Andrew W. Lai, Fremont, CA (US)

(73) Assignee: Xilinx, Inc., San Jose, CA (US)

( * ) Notice: Subject to any disclaimer, the term of this patent is extended or adjusted under 35 U.S.C. 154(b) by 426 days.

(21) Appl. No.: 11/880,158

(22) Filed: Jul. 19, 2007

(51) Int. Cl.
*G01R 31/28* (2006.01)
(52) U.S. Cl. ............................................. 714/725
(58) Field of Classification Search ............... None
See application file for complete search history.

(56) References Cited

U.S. PATENT DOCUMENTS

| | | | | |
|---|---|---|---|---|
| 5,581,177 A | * | 12/1996 | Hussey et al. ............ 324/158.1 |
| 5,727,021 A | * | 3/1998 | Truebenbach ............... 375/226 |
| 6,421,784 B1 | * | 7/2002 | Chu et al. ..................... 713/401 |
| 6,798,241 B1 | * | 9/2004 | Bauer et al. .................... 326/40 |
| 7,496,803 B2 | * | 2/2009 | Khondker et al. ........... 714/700 |
| 2005/0028050 A1 | * | 2/2005 | Ganry ......................... 714/700 |

* cited by examiner

*Primary Examiner*—Kevin L Ellis
*Assistant Examiner*—Guerrier Merant
(74) *Attorney, Agent, or Firm*—Lois D. Cartier

(57) ABSTRACT

Functional testing of an integrated circuit (IC) is a part from a more comprehensive and thorough testing. An IC including an embedded select circuit module coupled to receive numerous input signals. The IC may also include control circuit coupled to receive input control signals, where at least one input control signal of the input control signals is a mode signal. Asserting the mode signal may operate the select circuit module in a test mode.

15 Claims, 6 Drawing Sheets

US 7,685,486 B1

TESTING OF AN EMBEDDED MULTIPLEXER HAVING A PLURALITY OF INPUTS

FIELD OF THE INVENTION

The invention relates to integrated circuit (IC) devices. More particularly, the invention relates to testing of an IC.

BACKGROUND

Comprehensive testing of IC devices that are used in various applications is an integral part of producing a quality product. It is very costly when an IC device malfunctions due to incomplete testing or other form of failure. Replacement or repair cost increase exponentially when a failing device has been integrated in a product, such as a consumer electronics product. The malfunction of a single IC device may cause the product to fail.

IC devices are designed to include numerous transistors and logic circuits. Each transistor and logic circuit may have a particular function, or coupled to form a system performing a task of an IC. In some instances, issues may be encountered during the fabrication of the various transistors and/or the process of coupling these transistors to one another. A defective transistor or the coupling of such transistor may render an entire IC unusable. One goal of IC testing is to identify circuits that may have a defect due to fabrication or processing, while a secondary goal is to identify the location of such defect.

One type of IC is a programmable logic device (PLD) such as a field programmable gate array (FPGA), which is designed to be user-programmable such that a user may implement logic designs of his/her choice. In a typical FPGA an array of configurable logic blocks (CLBs) may be coupled to programmable input/output blocks (IOBs). The CLBs and IOBs are interconnected by a hierarchy of programmable routing resources. These CLBs, IOBs, and programmable routing resources are customized by loading a configuration bitstream into configuration memory cells of the FPGA. Since implementations of a circuit design in an FPGA have become more complex, the number of CLBs, IOBs, and other resources (such as multiplexers and block RAMs) have increased. Also, the routing resources to make the connections between the various blocks have increased as well. Programmable logic devices are one group of integrated circuits which particularly benefit from multi step testing, such as functional testing, performance testing, etc. Typically, an FPGA includes many select modules distributed throughout the device. In an example, an IOB may have at least one select module, where a select circuits may be used to couple between numerous input/or output signals coupled to the IOB.

Testing of an IC including embedded multiplexers/select circuits having numerous terminals can be very challenging, specifically if the numerous terminals can not be accessed directly. In general, multiplexers/select modules have vast design implementations. Therefore, ensuring proper testing of the select modules and other circuits is imperative to the success of the various implementations of a design of an IC. In another example, a PLD may include numerous multiplexers/select modules. A circuit designed including select module implementation may undergo modifications during the development phase of a product. It is crucial to ensure that all select modules implemented in a design are free of defects, in order to concentrate on the design aspect rather than the uncertainty revolving around IC defects, and specifically defects in the select modules.

Therefore, the need exists for test method and system for verifying and/or functionally testing select circuits/modules implemented in an IC to be free of defects.

SUMMARY

According to an embodiment of the present invention, an integrated circuit including a first select circuit coupled to numerous input signals and numerous first control signals. The integrated circuit may also include a second select circuit coupled to receive an output of the first select circuit, a complement of the output of the first select circuit, and a second control signal, where the second control signal operated the second select circuit in a test mode. At least one inverter is coupled between an input signal of the numerous input signals and an input of the first select circuit. Operating the second select circuit in the test mode, if a value observed on an output of the second select circuit does not equal to an expected value then a fault is detected.

In another embodiment of the present invention, a method for testing a select module coupled to receive outputs of a delay line may include providing a static logic value coupled to an input of the delay line. The method may also include providing numerous control signals coupled to the select module. Generating a mode signal coupled to the select module, where the mode signal operates the select module in a test mode. Comparing an output of the select module to a logic value, where operating the select module in the test mode, if a logic value coupled to an output of the select module equals an expected value, then no fault is detected, and where if a logic value coupled to the output of the select module does not equal an expected value, then a fault is detected.

BRIEF DESCRIPTION OF THE DRAWINGS

The present invention is illustrated by way of example, and not by way of limitation, in the following figures.

DETAILED DESCRIPTION OF THE DRAWINGS

While the specification concludes with claims defining some features of the invention that are regarded as novel, it is believed that the invention will be better understood from a consideration of the description in conjunction with the drawings. As required, detailed embodiments of the present invention are disclosed herein; however, it is to be understood that the disclosed embodiments are merely exemplary of the invention, which can be embodied in various forms. Therefore, specific structural and/or functional details disclosed herein are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting but rather to provide an understandable description of the invention. In other instances, well-known circuits and devices may be omitted or presented in an abstract form in order to avoid obscuring the present invention.

Figure 1:
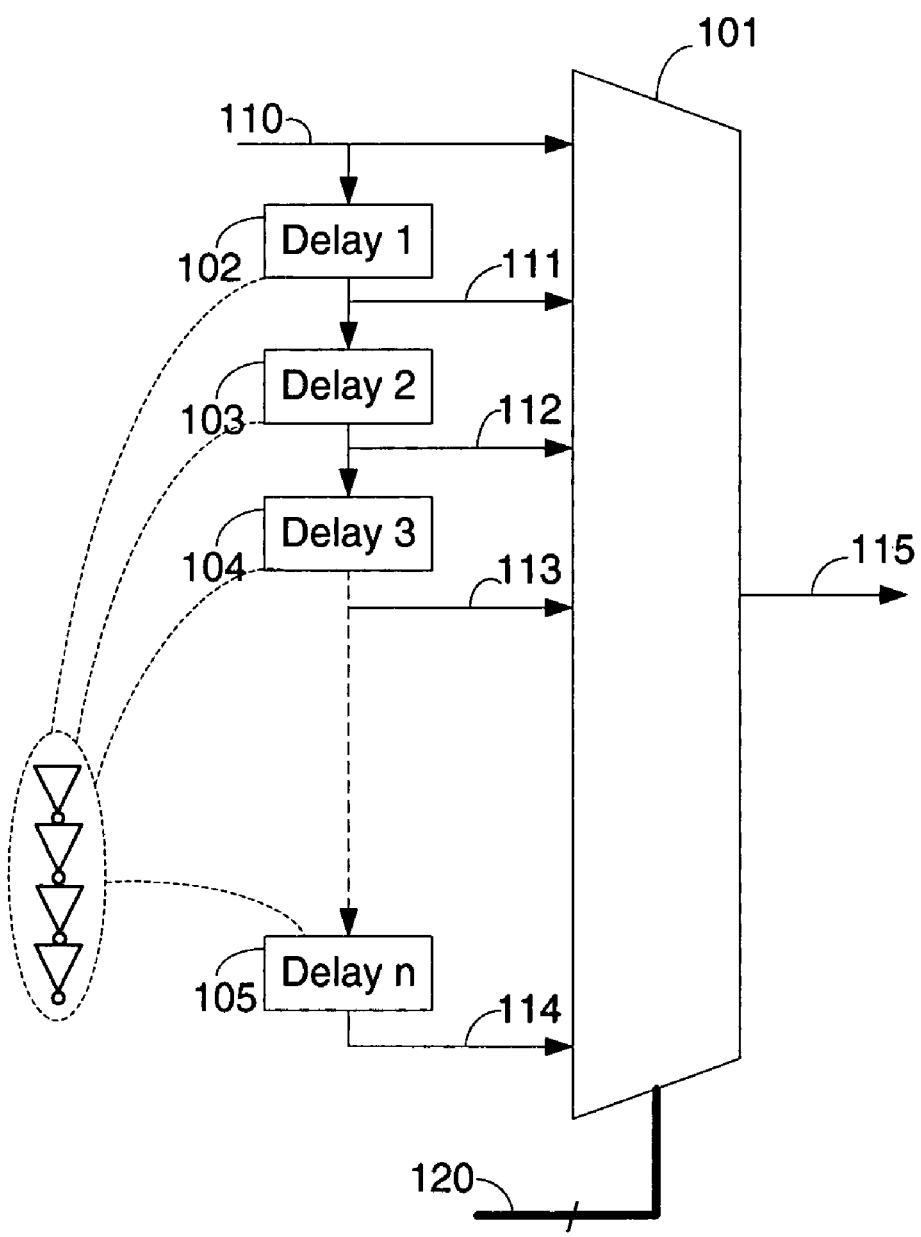
FIG. 1 shows a block diagram of a select circuit coupled to receive outputs of a delay line.

FIG. 1 shows a block diagram of a select circuit coupled to receive outputs of a delay line. In general, circuit 100 is a multiplexer circuit coupled to receive numerous signals from a delay line. The output signal 115 of circuit 100 may be coupled to signal 110 or a delayed version of signal 110 (signals 111-114) based on control signal 120. The above statement is valid when signal 110 is a dynamic signal. If a static value is coupled to signal 110, the output of circuit 101 may provide a static value coupled to signal 115 equals to a value coupled to signal 110. Circuit 100 includes a select or multiplexer (MUX) circuit 101, and a delay line having delay circuits 102-105. Circuit 101 may be coupled to receive signals 110, 111-114 (outputs of delay circuits 102-105), and may generate an output coupled to signal 115.

Input signal 110 may be coupled to an input of select circuit 101 and an input of delay circuit 102. Signal 110 may be a timing signal, and it may be provided by an external and/or internal source. In an example, a system may have many ICs, where at least one IC has input/output (I/O) circuits including circuit 100. An IC of the system may have an output coupled to signal 110. Delay circuits 102-105 may be a part of a delay line, where each delay circuit may have a predetermined delay. Also, delay circuits 102-105 may be coupled serially to one another (as shown in FIG. 1) to form the delay line. In general, a delay line may have numerous delay elements having numerous outputs or taps, where each tap may have a delayed version of a signal. A desired delay output/tap 110-114 may be selected and coupled to the output 115 of the select circuit 101 (signal 115) by asserting a value on select control signal 120. In the example shown in FIG. 1, circuit 102 may be coupled to receive signal 110 and provide signal 111. Signal 111, the output of delay circuit 102, may be coupled to input of delay circuit 103, and output of delay circuit 103 (signal 112) may be coupled to input of delay circuit 104, etc. Signals 111-114 are provided by delay circuits 102-105 respectively, and they are coupled to inputs of the select circuit 101. Delay circuits 102-105 may utilize passive and/or active circuits to generate a desired delay. For example, delay circuit 102 may include inverters that are coupled to one another to provide a delay. Other delay circuit implementations, such as capacitors, may be used and they are well known to persons skilled in the art.

A programmable logic device (PLD), a well known type of an IC, may include at least one circuit 100. Defects caused by process, fabrication, and integration may affect select circuit 101. In general, a circuit fails when its observed behavior is different from its expected one. For example, testing an embedded circuit to be free of defects, such as the select circuit 101 discussed above, may be very challenging, particularly if the inputs of the select circuit 101 cannot be accessed directly. A testing method of circuit 100 may be achieved by coupling a value to signal 110 and observing signal 115. Signals 111-114 are generally generated based on signal 110, and we may not easily distinguish difference between them. For instance, delay differences between signals 111-114 and signal 110 may be very small and accurate instrumentations are necessary to perform such measurements. Therefore, functional testing of circuit 100 may not reveal defects. Performance testing of circuit 100 is possible and may uncover failures or defects. In general, performance testing requires specialized accurate instrumentations. Employing such instrumentations can be very expensive, in terms of unit cost and time needed to acquire the measurements which is impractical for production testing. So, it is desirable to functionally test circuit 100 and identify failures at an early stage of the test process.

One failure mode of an IC that can be addressed by functional testing or static testing is a stuck-at-fault failure. A stuck-at-fault is a particular failure model that may be addressed by automatic test equipments (ATEs) to identify manufacturing defect within an IC. A stuck-at-fault is assumed to affect interconnection between gates and in some instances shorts in transistors. Each connection line can have two types of faults: stuck-at-1 and stuck-at-0. Therefore, a line with a stuck-at-1 fault will always have a logic state "1" irrespective of the correct logic output of the gate driving it. Conversely, a line with a stuck-at-0 fault will always have a logic state "0" irrespective of the correct logic output of the gate driving it.

Figure 2:
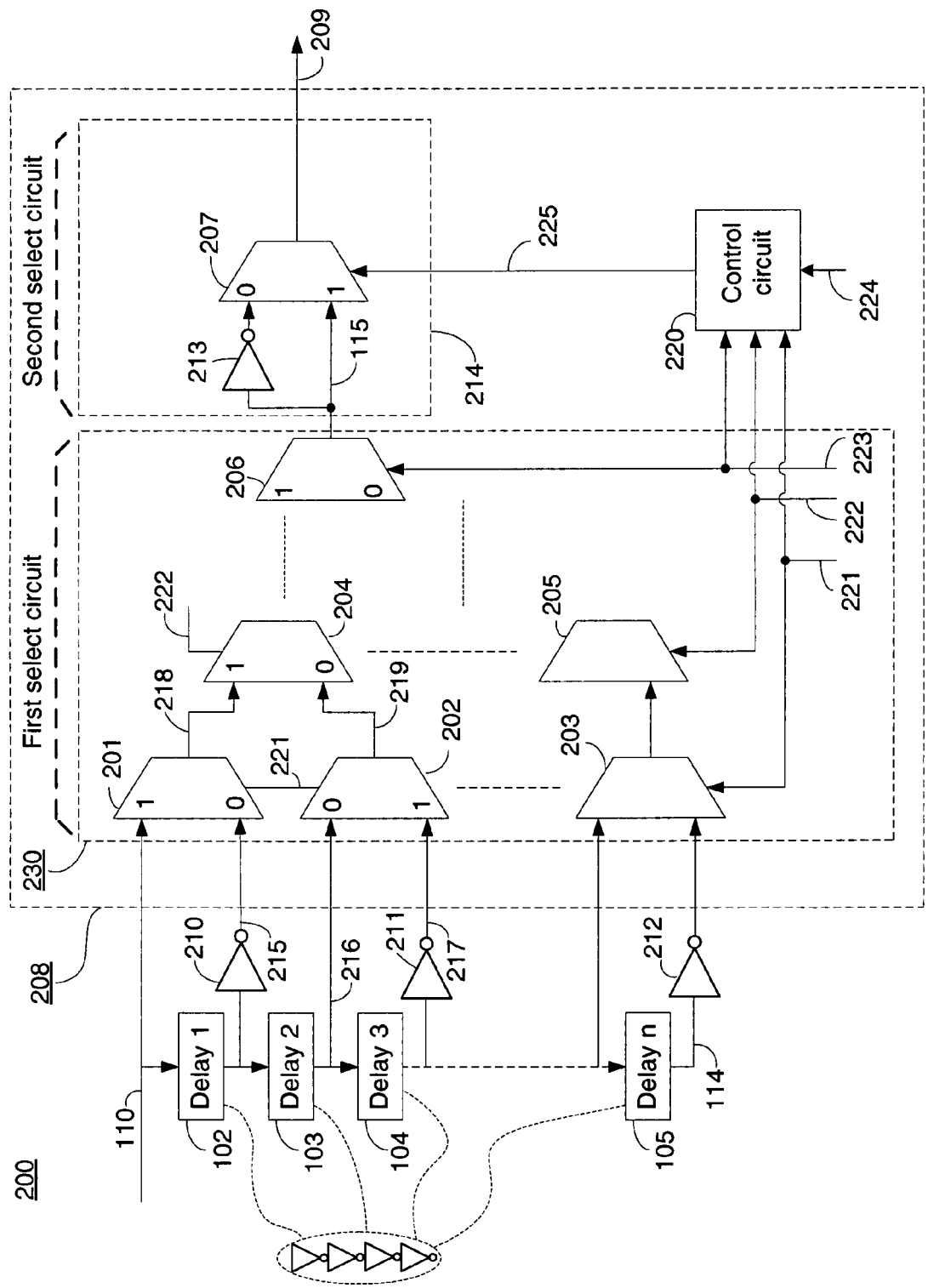
FIG. 2 shows a block diagram of multiplexer (MUX) circuits coupled to receive outputs of a delay line according to an embodiment of the present invention.

FIG. 2 shows a block diagram of multiplexer (MUX) circuits coupled to receive outputs of a delay line according to an embodiment of the present invention. Circuit 200 is a configurable delay select circuit, having an output coupled to signal 209. Signal 209 may have a value equal to a value coupled to signal 110 or delayed versions of signal 110. The delayed versions of signal 110 are provided by delay circuits 102-105. Circuit 200 may include a delay line, a first select circuit 230, a second select circuit 214, and control circuit 220. The delay line may include delay circuits 102-105, providing outputs coupled to the first select circuit 230 and to inverters 210-212. In an example, consecutive inputs to the first select circuit 230 may be inverted from one another. Circuit 200 has two modes of operation, normal mode and test mode. When operating circuit 200 in the test mode and a static value is coupled to signal 110, then either the value of signal 110 or a complement of the value coupled to signal 110 may be observed on signal 209. When operating circuit 200 in the normal mode and a static value is coupled to signal 110, then output signal 209 may have a value equal to the value coupled to signal 110. In general operating circuit 200 in the normal mode is similar to the operation of circuit 100 of FIG. 1.

The first select circuit 230 may have similar operation to circuit 101 of FIG. 1. Circuit 230 may include numerous 2:1 MUX circuits 201-206 as shown in FIG. 2. Signal 110 of FIG. 2 is coupled to the "1" input of MUX circuit 201, and a complement of an output, signal 215, of circuit 102 (provided by inverter 210) is coupled to the "0" input of circuit 201. Signal 216, output of delay circuit 103, is coupled to the "0" input of MUX circuit 202, while signal 217, a complement of an output of circuit 104 (provided by inverter 211), is coupled to the "1" input of circuit 202, etc. Signals 218 and 219 outputs of circuits 201 and 202 are coupled to the "1" and "0" inputs respectively of MUX circuit 204. MUX circuits 201-203 are coupled to receive control/select signal 221, and MUX circuits 204-205 are coupled to receive control/select signal 222, etc. Asserting control signal 221 may couple either the "1" or "0" inputs of MUX circuits 201-203 to the respective inputs of MUX circuits 204-205.

MUX circuit 207 may have the "1" input coupled to the output of circuit 230 and the "0" input coupled to a complement of circuit 230 (provided by inverter 213). A select input of MUX circuit 207 may be coupled to signal 225 provided by the control circuit 220. The control circuit 220 may be a combinational logic circuit having inputs coupled to signals 221-224 and provides an output coupled to signal 225. For example, signal 224 may be a test or mode signal for operating circuit 200 in the test mode. For instance, coupling logic high "1" to control signal 224 (test mode) may assert signal 225 (output of control circuit 220). In the test mode, the "1" input of MUX circuit 207 (signal 115) is coupled to signal 209. Therefore, a value coupled signal 110 or the complement of the value coupled to signal 110 may be observed on signal 209. A stuck-at-fault may be detected if the value observed on signal 209 does not match a selected value coupled to an input of circuit 230.

Conversely, coupling logic low "0" to signal 224 (non-test/normal mode), where control circuit 220 provides an output coupled to signal 225 based on control signals 221-223. Operating in the normal mode, circuit 200 may function similar to circuit 100 of FIG. 1. Therefore, when an inverted signal is selected, such as signal 215, and signal 217, then circuit 220 asserts signal 225 to select the "0" input of MUX 207. The inverter 213 may negate the effect of the selected inverted signal provided by either inverter 210 or inverter 211.

Operating circuit 200 in the test mode may enable the functional testing of MUX circuits 201-206. While in the test mode, if a value observed on signal 209 does not equal an expected value, then a fault is detected and the device may be rejected. Conversely, if a value observed on signal 209 equals an expected value, then no fault is detected and further testing may commence.

The circuit 230 may include numerous 2:1 MUX circuit 201-206, other types of MUX circuits may be used, such as 4:1 MUX circuits. Using 4:1 MUX circuits may require some modifications, for example, to the control logic 220 may require additional decoding logic. A skilled person in the art may determine the best type of MUX circuits to be used to implement circuit 230. For example, signal 110 may be coupled to a "1" input of MUX circuit 201, and signal 215 (output of inverter 210) coupled to a "0" input of the MUX circuit 201. MUX circuit 202 may have a "0" input coupled to signal 216 and a "1" input coupled to signal 217. Signal 216 is an output of delay circuit 103, and signal 217 is a complement of an output of delay circuit 104 (provided by inverter 211). In general, delay circuit 102-105 may provide a small delay (e.g., 100 ps). Therefore, circuit 200 may be used to add delay to signal 110. For example, delay to signal 110 may be necessary to meet a timing criteria.

Each of the MUX circuits 201-203 may have a select control input coupled to receive the control signal 221. A logic value coupled to the control signal 221 may enable each of the MUX circuits 201-203 to couple a "1" input or a "0" input to their respective outputs. For example, if a logic high "1" is coupled to control signal 221, the "1" inputs of MUX circuits 201-203 may be coupled to their respective outputs. If logic high "1" is coupled to control signal 221, signal 218, output of MUX circuit 201, may have value equal to a value of signal 110, and signal 219, output of MUX circuit 202, may have value equal to a value of signal 217. Conversely, if logic low "0" is coupled to control signal 221, signal 218 may have value equal to a value of signal 215, and signal 219 may have value equal to a value of signal 216. The above mentioned example may be applied to all MUX circuits coupled to receive outputs from the delay line and having a select control input coupled to signal 221.

Control circuit 220 may include logic circuits coupled to receive signals 221-224 and provide signal 225. In the test mode, signal 225 configures MUX circuit 207 to couple signal 209 to signal 115 (output of circuit 230). Additionally, toggling control signals 221-223 may not modify signal 225 in the test mode. While in the test mode, circuit 200 is configured to allow the functional testing of MUX circuits 201-206 for stuck-at-faults. In the test mode signals 221-223 may be modified to gain access to input/output (I/O) nodes of MUX circuits 201-206. MUX circuits 201-206 may selectively couple the "1" input or the "0" input based on control signals 221-223. There are many types of signaling that may be applied to signals 221-223, such are binary code, gray code, etc. For example, gray code may be used in the test mode to modifying the control signals 221-223 in order to efficiently access I/O nodes of MUX circuits 201-206. Gray code is a binary numeral system where two successive values differ in only one digit. Other methods of modifying control signals 221-223 are possible and it is well known to persons skilled in the art. The above steps may also allow the observation and functional verification of control signals 221-224. The circuit described in FIG. 2 may have a minimal overhead cost associated with its implementation. Such overhead cost many include control circuit 220 and inverters 210-213, where control circuit 220 and inverters 210-213 may require additional area and/or power. In an example, to minimize the area impact of circuit 200 and for other reason (e.g., for more uniform tap delay), inverter circuits 210-213 may be absorbed within the MUX circuits 201-203 or the delay circuits 102-105. Incorporating the method above may preserve the overall performance of the circuit 200 with the added benefit of test for stuck-at-fault capability. Other methods of incorporating elements of circuit 200 are possible and well known to persons skilled in the art. Other benefits from introducing the test mode to circuit 200 may include superior IC quality, test time reduction, and fault isolation for failure analysis measures. The quality of the IC may be increased by enhancing the test coverage, where circuit 200 includes such elements. Test time reduction and fault isolation may be associated to one another. If a fault is identified in circuit 200, failing the faulty IC at an early stage of the test procedure will save valuable tester time. Additionally, during the test procedure recording the failing circuit attributes, such as time stamp, or test vector number, may narrow or identify the location where the failure may have occurred. Therefore, speedy failure analysis of the IC may be possible due to the information provided by the test procedure.

Figure 3:
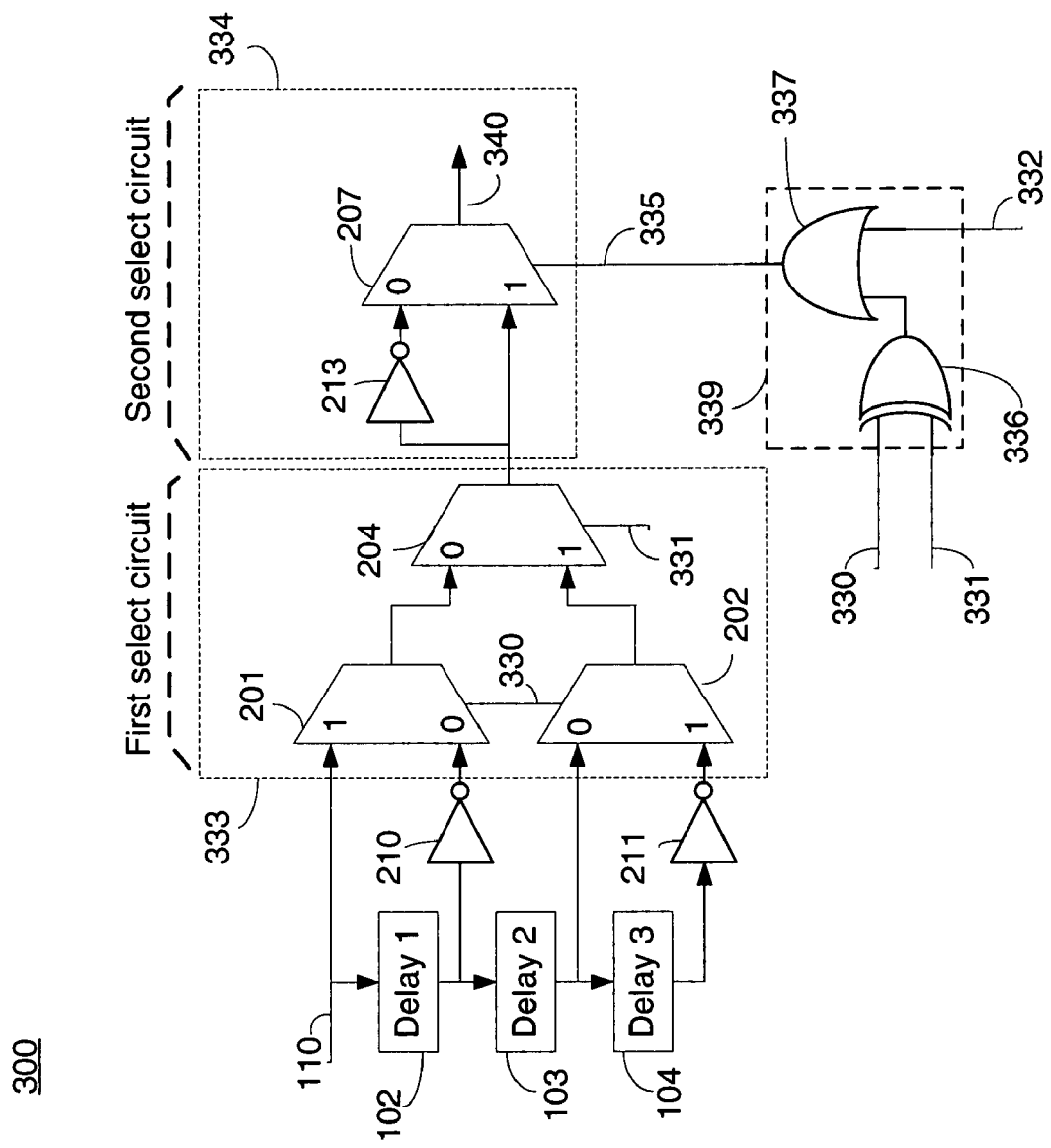
FIG. 3 illustrates schematically a simplified version of the MUX circuits of FIG. 2 according to an embodiment of the present invention.

FIG. 3 illustrates schematically a delay line coupled to select circuits according to an embodiment of the present invention. Circuit 300 is a simplified version of circuit 200 of FIG. 2 for the case where there are four taps from the delay line. As shown in FIG. 3, circuit 300 includes a delay line having delay circuits 102-104, a first select circuit 333, a second select circuit 334, and a control circuit 339. In an example, the delay circuits 102-104 each may include an even number of inverters coupled serially to one another forming a buffer circuit having a delay. Circuit 300 also can be operated in a test mode to verify the circuit is free of defects or stuck-at-faults. In the test mode, signal 340 may be coupled to an output of the first select circuit 333 (output of MUX circuit 204). In the non-test/normal mode, signal 110 or delayed versions of signal 110 may be coupled to signal 340. Therefore, circuit 300 can be viewed as a delay line coupled to a 4:1 MUX circuit while operating in the non-test/normal mode.

Detailing the operating of circuit 300 in the test mode may provide a simplified explanation of the operation of circuit 200. Circuit 300 may be configuring to operate in the test mode, where signal 332 may enable that feature. A value coupled to the inputs of the MUX circuits 201-202, and 204 can be observed on signal 340 (output of MUX circuit 207). In an example, the control circuit 339 may include XOR circuit 336 and OR circuit 337. The control circuit 339 may be coupled to receive signals 330-332 and provide signal 335 coupled to a select input of the 2:1 MUX circuit 207. For example, signal 332 may be a mode or a test signal that when asserted may operate circuit 300 in the test mode. The XOR circuit 336 is coupled to receive signals 330 and 331 and generates an output coupled to a first input of OR circuit 337. The OR circuit 337 may have a second input coupled to signal 332, and can generate an output coupled to signal 335. For instance, by coupling logic high "1" to signal 332, the output of the OR circuit (signal 335) is forced to logic high "1" regardless of a value coupled to the other input of the OR circuit. Generating logic high "1" coupled to signal 335 configures the MUX circuit 207 to couple the "1" input to signal 340, therefore operating circuit 300 in the test mode. Table 1 is a truth table representing circuit 300 operating in the test mode. In another example, if logic low "0" is coupled to mode signal 332 (normal mode), the OR circuit 337 may generate an output coupled to signal 335 having a logic value based on the first input of the OR circuit. Therefore, signal 335 may be responsive to an output of the XOR circuit 336 (in the normal mode). Table 2 is a truth table representing circuit 300 operating in the non-test/normal mode. Other implementations of the control circuit of circuit 300 are possible and well known to persons skilled in the art.

Table 1 represents circuit 300 operating in the test mode, where signals 110, 330, 331, 332 are inputs to circuit 300, and signal 340 is an output of the circuit 300. The output values presented in Table 1 represent expected values (i.e., no stuck-at-faults). Signal 110 may be an input to the delay line and may be coupled to the "1" input of select circuit 201, and signal 332 may be the mode signal, where coupling logic high "1" to signal 332 may configure circuit 300 to operate in the test mode

TABLE 1

| Input | Control signals | | | Output |
|---|---|---|---|---|
| Mode | Signal 110 | Signal 332 | Signal 331 | Signal 330 | Signal 340 |
| Test | 1 | 1 | 0 | 0 | 0 |
| | 1 | 1 | 0 | 1 | 1 |
| | 1 | 1 | 1 | 0 | 1 |
| | 1 | 1 | 1 | 1 | 0 |
| | 0 | 1 | 0 | 0 | 1 |
| | 0 | 1 | 0 | 1 | 0 |
| | 0 | 1 | 1 | 0 | 0 |
| | 0 | 1 | 1 | 1 | 1 |

Table 2 shows circuit 300 operating in the non-test/normal mode, where signals 110, 330, 331, 332 are the inputs, and signal 340 is the output of the circuit 300. Values of output signal 340 in Table 2 represent expected results or values. If other than the expected value is observed on signal 340, then a defect in the control circuit 339 and/or the select circuits 201-202, 204, and 207 is present. Signal 110 is the input to the delay line, and signal 332 may be the mode signal, where logic low "0" coupled to signal 332 may configure circuit 300 to operate in the normal/non-test mode.

TABLE 2

| Input | Control signals | | | Output |
|---|---|---|---|---|
| Mode | Signal 110 | Signal 332 | Signal 331 | Signal 330 | Signal 340 |
| Normal | 1 | 0 | 0 | 0 | 1 |
| | 1 | 0 | 0 | 1 | 1 |
| | 1 | 0 | 1 | 0 | 1 |
| | 1 | 0 | 1 | 1 | 1 |

TABLE 2-continued

| Input | Control signals | | | Output |
|---|---|---|---|---|
| Mode | Signal 110 | Signal 332 | Signal 331 | Signal 330 | Signal 340 |
| | 0 | 0 | 0 | 0 | 0 |
| | 0 | 0 | 0 | 1 | 0 |
| | 0 | 0 | 1 | 0 | 0 |
| | 0 | 0 | 1 | 1 | 0 |

Table 2 is an illustration of circuit 300 operating in the normal mode. A static value coupled to signal 110 or outputs from delay circuits 102-104 may be observed on signal 340. Functional testing in the normal mode may be necessary, and the testing may reveal defects in the control logic (e.g., circuit 339) and/or select circuits. Table 1 shows operating circuit 300 in a test mode, where signal 340 may provide a logic value equal to a selected value coupled to inputs of MUX circuits 201, 202. Modifying the control signals 330 and 331 may enable logic values coupled to inputs of MUX circuits 201 and 202 to be observed at signal 340. If an observed value coupled to signal 340 does not match an expected value, then a stuck-at-fault is detected.

For example, if circuit 300 is operating in the test mode and if the output of MUX 201 is stuck high logic "1,", then this error may be detected in one of two methods. The first method is when a logic low "0" is coupled to signal 110 and the "1" input of MUX 201 is selected for observation (by asserting signals 330-331). Since the output of MUX 201 is stuck high, then the circuit 300 may fail, because the expected value "0" does not match the observed value "1" of signal 340. The second method is when a logic high "1" is coupled to signal 110 and the "0" input of MUX 201 is selected for observation (by asserting signals 330-331). Since the output of MUX 201 is stuck high, then the circuit 300 may fail because the inverter 210 provides the complement of signal 110. Therefore, the circuit fails because the expected value "0" does not match the observed value "1," of signal 340.

Figure 4A:
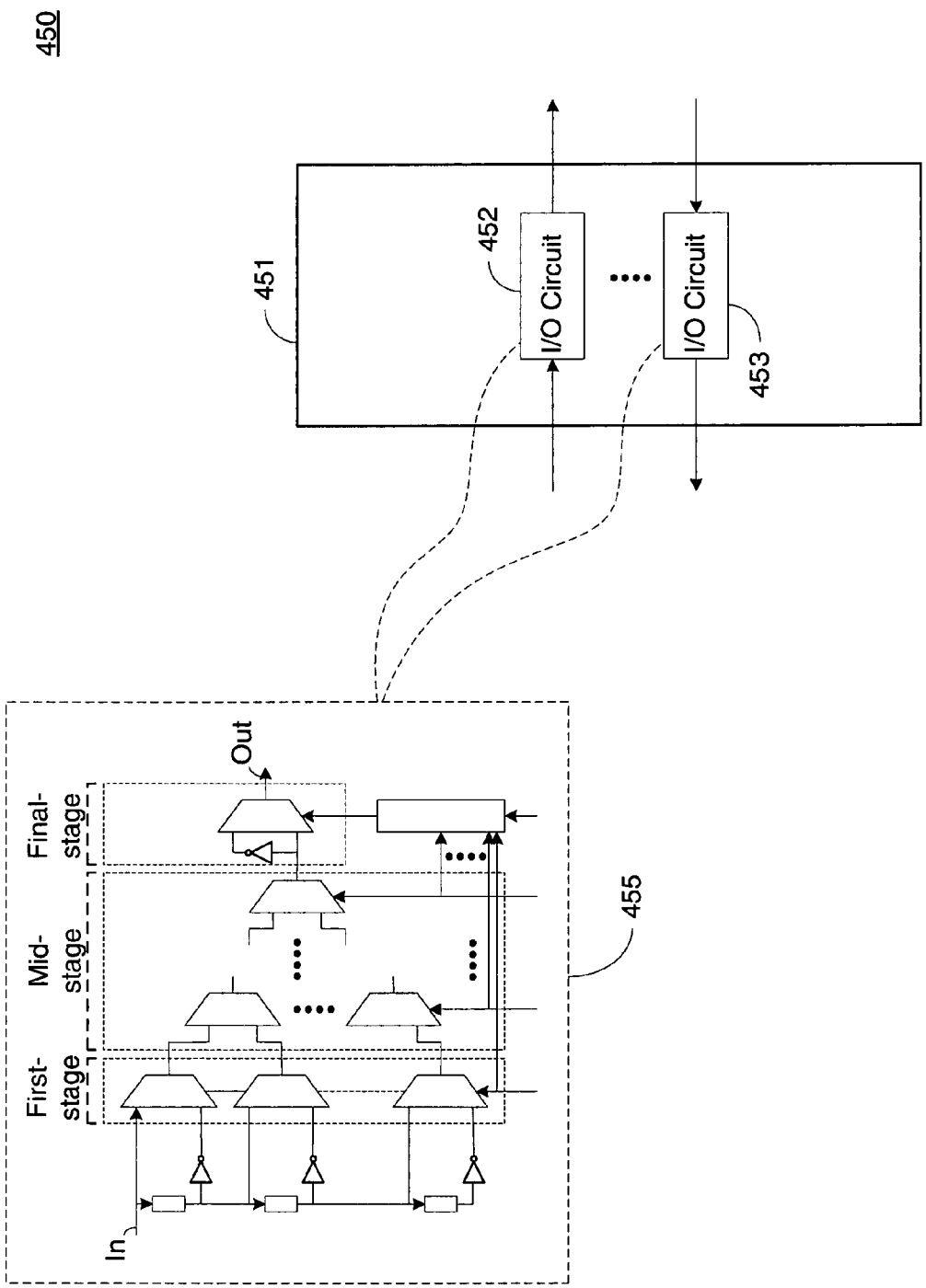
FIG. 4A shows a block diagram of an input/output (I/O) circuit including a configurable delay select circuit according to an embodiment of the present invention.

FIG. 4A shows a block diagram of an integrated circuit 451 including input/output (I/O) circuits 452-453. The I/O circuits 452-453 may include a select circuit 455 coupled to a delay line according to an embodiment of the present invention. In one example, the IC including the select circuit 455 may be a part of a system having numerous ICs coupled to one another. The select circuit(s) 455 may be used to compensate for delays encounters as byproduct of the coupling. For instance, if numerous long conductors are used to couple terminals of ICs, the delay due to the long length of the conductors (i.e., capacitive and/or resistive load delay) may be unacceptable. The delay circuit(s) 455 may be used to equalize delays between terminals.

The select circuit 455 shown in FIG. 4A may include three select stages, a first-stage, a mid-stage, and a final-stage. The select circuit 455 in FIG. 4A is similar to the select circuit illustrated in FIG. 2. The difference is only in the way it is illustrated. For instance, the first-stage and the mid-stage of select circuit 455 is similar to the first select stage 230 of FIG. 2, and the final stage of circuit 455 is similar to the second select stage 214 of FIG. 2. The first-stage of circuit 455 may include numerous 2:1 select/multiplexer (MUX) circuits coupled to receive numerous outputs of a delay line. The numerous 2:1 select circuits of the first-stage include numerous select inputs, where all the numerous select inputs of the first-stage 2:1 select circuits are coupled to one another and to a first-stage control signal. The mid-stage of circuit 455 may include numerous 2:1 select/multiplexer (MUX) circuits.

Inputs of the numerous of mid-stage select circuits may be coupled to outputs of the first-stage select circuits. The mid-stage select circuits may also have select inputs coupled to receive mid-stage control signals. The final-stage of circuit 455 may include a 2:1 select/multiplexer (MUX) circuit, having a first input coupled to an output of the mid-stage and a second input coupled to a complement of the output of the mid-stage. The final stage may also have a select input coupled to receive a final-stage control signal that may operate the final-stage in a test mode. The test mode may be invoked in order to facilitate functional testing of the configurable delay select circuit. The final-stage control signal can be provided by a control circuit. The control circuit may be coupled to receive the first-stage control signal, the mid-stage control signals, and a mode or a test signal. When the mode/test signal is asserted, the control circuit may assert the final-stage control signal to couple an output of the final-stage to the output of the mid-stage. In the test mode, if a value observed on the output of the final-stage does not match an expected value, then a fault is detected and the configurable delay select circuit is defective. Conversely, if an observed value on the output of the final-stage does match an expected value, then functional testing of the configurable delay select circuit yielded no errors.

Figure 4B:
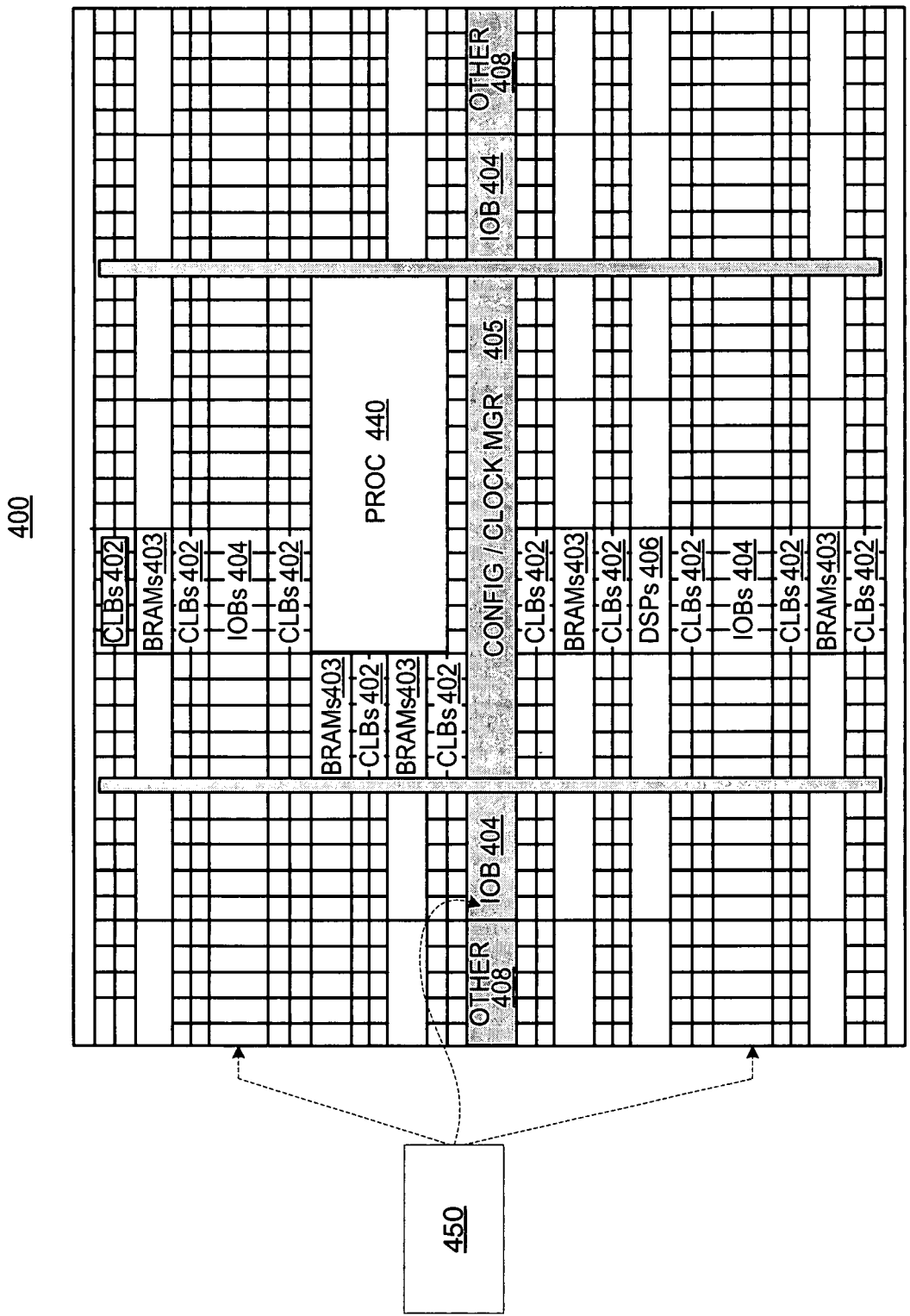
FIG. 4B illustrates a programmable logic device (PLD) including the I/O circuit of FIG. 4A according to an embodiment of the present invention.

FIG. 4B illustrates a programmable logic device (PLD) including the I/O circuit according to an embodiment of the present invention. A PLD is a well-known type of integrated circuit that may be programmed to perform specified logic functions. One type of PLD, the field programmable gate array (FPGA), typically includes an array of programmable tiles. These programmable tiles may include, for example, input/output blocks 404 (IOBs), configurable logic blocks 402 (CLBs), dedicated random access memory blocks 403 (BRAM), multipliers, digital signal processing blocks (DSPs) and/or processors 440, clock managers 405 that may include delay lock loops (DLLs), and so forth. In an example, the IOB 404 may include the configurable delay select circuit 455 of FIG. 4A. Circuit 455 may be included with other circuits, such as digital clock manger (DCM), and circuits utilizing delay lines.

Functionally testing of the configurable delay select circuit 450 of FIG. 4B is a part of more comprehensive testing procedure. In general, functional testing, performance testing, and parametric tests of circuits may ensure a superior quality of an IC or a PLD. Incorporating the test mode in the circuit 450 may contribute to test time reduction of the PLD, which may yield tangible cost saving. The test time reduction may be realized by rejecting the device under test (DUT) at an earlier stage of the testing procedure. The test mode feature may also allow the testing of such circuits where previously un-testable. Incorporating the test mode in circuit 450 may also support failure analysis proceedings. In the event where a device fails functional testing due to a defect of a configurable delay select circuit, a file may be created indicating the failure mode, which section of the PLD the failure occurred, etc. The information included in such file may be a valuable tool in locating such failing circuit.

Figure 5:
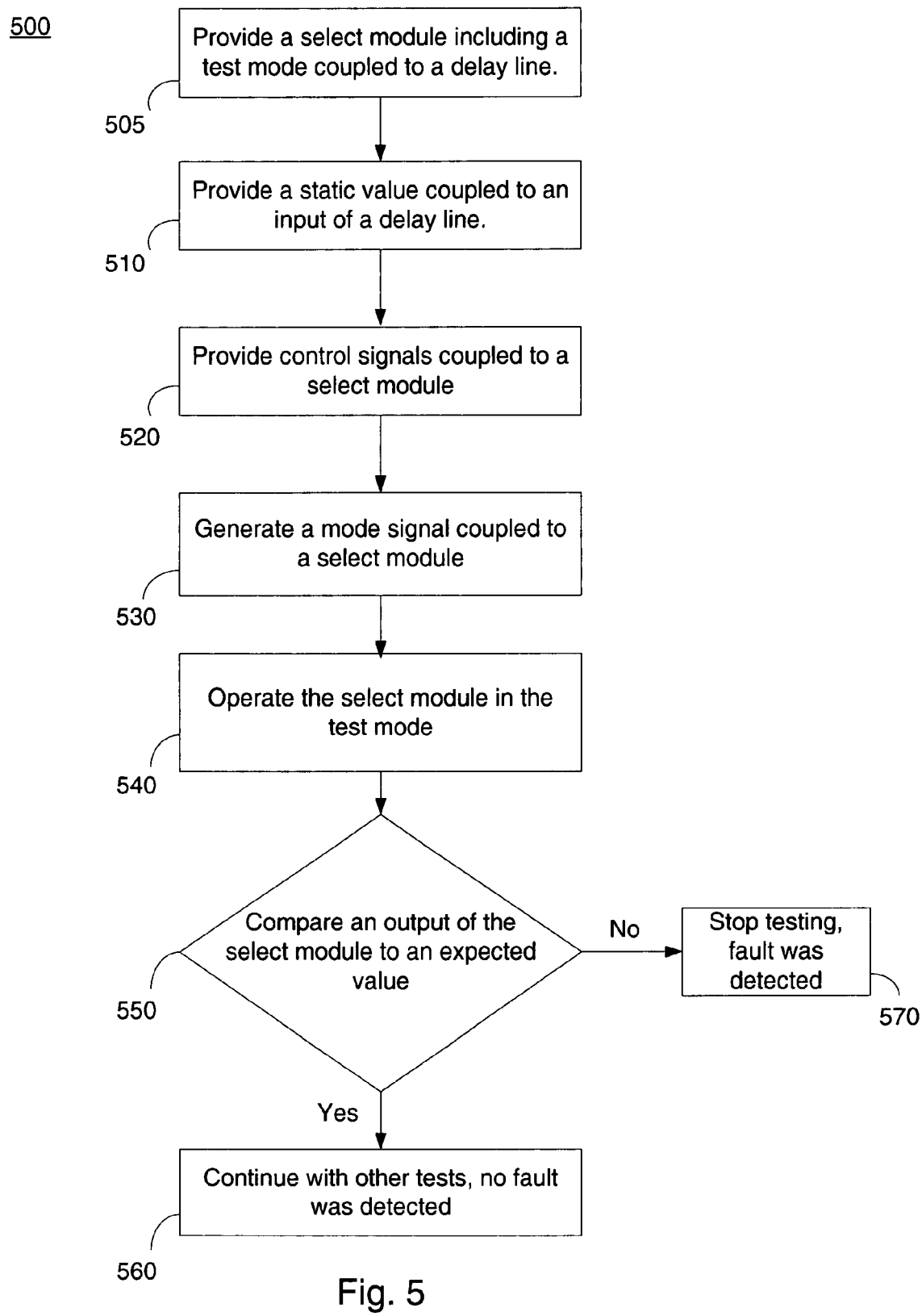
FIG. 5 illustrates a flow chart for testing a select module according to an embodiment of the present invention.

FIG. 5 illustrates a flow diagram for testing a select module according to an embodiment of the present invention. The flow diagram 500 describes method steps to test a select module including a test mode and having inputs coupled to outputs of a delay line. In an example, consecutive inputs of the select module are inverted from one another. The test method may start by providing a select module including a test mode coupled to a delay line (step 505). At step 510, a static value may be coupled to an input of the delay line. At step 520, numerous control signals coupled to the select module are provided, where the numerous control signals selectively couple one of the inputs to the output of the select module. At step 530, a mode signal coupled to the select module may be generated, where the mode signal (if asserted) configures the select module to operate in a test mode (step 540). For instance, operating the select module in the test mode may enable functional testing of the select module to allow for stuck-at-faults identification. In an example, the mode signal may be generated by logically combining the provided control signals and a test signal. At step 550, an output of the select module is compared to an expected value. For instance, the expected value is either the static signal coupled to the input of the delay line or its complement.

At step 560, we may continue with testing if a value of the output of the select module matches the expected value (i.e., no fault was detected). At step 570, we may stop the testing of the device if a value of the output of the select module does not match the expected value (i.e., a fault was detected). For instance, a data log may be generated after stopping the test. The data log may be used in the process of failure analysis. At step 560, different values may be coupled to the control signals in order to enable different paths from inputs to the output of the select module. Stepping through all possible combinations of the control signals may allow the detection of any stuck-at-fault (if present). The method steps 510-570 described above may be applicable to an IC including numerous select modules. Such as a programmable logic device (PLD) having multiple input/output blocks (IOBs), where the IOBs may include the select module.

Further, resistors, capacitors, pullups, pulldowns, transistors, level shifters, P-channel transistors, N-channel transistors, biasing circuits, oscillators, clock dividers, and other components other than those described herein can be used to implement the invention. Active-high signals can be replaced with active-low signals by making straightforward alterations to the circuitry, such as are well known in the art of circuit design. Logical circuits can be replaced by their logical equivalents by appropriately inverting input and output signals, as is also well known. In one example, a logic low "0" coupled to signal 224 of FIG. 2 may operate circuit 200 in the test mode.

Moreover, some components are shown directly connected to one another while others are shown connected via intermediate components. In each instance the method of interconnection establishes some desired electrical communication between two or more circuit nodes. Such communication can often be accomplished using a number of circuit configurations, as will be understood by those of skill in the art.

Accordingly, all such modifications and additions are deemed to be within the scope of the invention, which is to be limited only by the appended claims and their equivalents. Note that claims listing steps do not imply any order of the steps. Trademarks are the property of their respective owners.

What is claimed is:

1. An integrated circuit (IC), comprising:
a first select circuit coupled to receive a plurality of input signals and a plurality of first control signals;
at least one inverter coupled between an input signal of the plurality of input signals and an input of the first select circuit; and
a second select circuit coupled to receive an output of the first select circuit, a complement of the output of the first select circuit, and a second control signal,
wherein the second control signal selectively operates the second select circuit in a test mode, and wherein when operating the second select circuit in the test mode, if a value observed on an output of the second select circuit does not equal to an expected value then a fault is detected, and wherein the expected value is a value coupled to a selected input of the first select circuit.

2. The integrated circuit recited in claim 1, further comprising a control circuit coupled to receive the plurality of first control signals and a mode signal, and generating the second control signal.

3. The integrated circuit recited in claim 1, further comprising a plurality of delay circuits coupled to receive a signal, and having a plurality of delay outputs for providing the plurality of input signals.

4. The integrated circuit recited in claim 3, wherein consecutive inputs of the first select circuit are inverted from one another.

5. The integrated circuit recited in claim 4, wherein the control circuit comprises:

an XOR circuit coupled to receive the plurality of first control signals;

an OR circuit coupled to receive an output of the XOR circuit and the mode signal, and generate the second control signal.

6. The integrated circuit recited in claim 5, wherein when operating in the test mode enables testing of the select module for stuck-at-faults.

7. The integrated circuit recited in claim 6, wherein the integrated circuit is a programmable logic device (PLD).

8. A method for testing a select module coupled to receive a plurality of outputs of a delay line, the method comprising:

providing a static logic value coupled to an input of the delay line;

providing a plurality of control signals coupled to the select module generating a mode signal coupled to the select module for configuring the select module in a test mode; and comparing an output of the select module to an expected value; wherein if the output of the select module equals the expected value, then no stuck-at-fault is detected, and wherein if the output of the select module does not equal the expected value, then a stuck-at-fault is detected;

wherein the step of providing the static logic value comprises inverting odd outputs of the outputs of the delay line.

9. The method recited in claim 8, wherein the step of generating the mode signal comprises logically combining the plurality of control signals with a test signal.

10. The method recited in claim 8, wherein the step of providing the static logic value further comprising coupling an even output of the outputs of the delay line followed by an odd output of the outputs of the delay line to the select module.

11. An integrated circuit (IC), comprising:

a delay line coupled to receive an input signal and providing a plurality of delay signals, wherein consecutive delay signals of the plurality of delay signals are inverted from one another;

a multiplexer circuit, comprising:

a first-stage comprising a first plurality of multiplexer circuits having inputs coupled to the plurality of delay signals, and select inputs coupled to a first-stage control signal;

a mid-stage comprising a second plurality of multiplexer circuits having inputs coupled to outputs of the first-stage, and select inputs coupled to mid-stage control signals; and a final-stage comprising a final-stage multiplexer circuit having inputs coupled to an output of the mid-stage and a complement of the output of the mid-stage, and a select input coupled to a final-stage control signal, wherein asserting the final-stage control signal operates the final-stage in a test mode, and wherein when operating the final-stage in the test mode, if a value coupled on an output of the final-stage does not match a value of a selected signal of the provided by the plurality of an expected value, a fault is detected.

12. The IC recited in claim 1, wherein the IC is a programmable logic device (PLD).

13. The IC recited in claim 12, wherein the delay line and the multiplexer circuit are a part of input/output circuit of the PLD.

14. The IC recited in claim 11, wherein each multiplexer circuit of the first plurality of multiplexer circuits is coupled to receive a delay signal and a complement of the delay signal of the plurality of delay signals.

15. The IC recited in claim 11, further comprising a control circuit coupled to receive the first-stage control signal, the mid-stage control signals, and a mode signal, and provides the final-stage control signal, wherein asserting the mode signal operates the final-stage in the test mode.

* * * * *